United States Patent [19]
Lee et al.

[11] Patent Number: 6,154,092
[45] Date of Patent: Nov. 28, 2000

[54] CIRCUITS FOR PREVENTING UNWANTED OUTPUT TRANSIENTS IN AMPLIFIERS DURING POWER-UP

[75] Inventors: Thean-Liang Lee, Milpitas; Frank W. Singor; Gaurang A. Shah, both of Sunnyvale, all of Calif.

[73] Assignee: Maxim Integrated Products, Sunnyvale, Calif.

[21] Appl. No.: 09/196,426

[22] Filed: Nov. 19, 1998

[51] Int. Cl.[7] .................................. H03F 1/14; H03F 3/26; H02H 7/20; H03M 1/66

[52] U.S. Cl. ............................. 330/51; 330/267; 330/298; 341/144

[58] Field of Search ............................. 330/51, 255, 264, 330/267, 268, 207 P, 298; 341/144

[56] References Cited

U.S. PATENT DOCUMENTS

| | | | |
|---|---|---|---|
| 3,569,849 | 3/1971 | Cassidy | 330/255 |
| 4,502,020 | 2/1985 | Nelson et al. | 330/267 |
| 4,973,916 | 11/1990 | Baik | 330/255 |
| 4,991,916 | 2/1991 | Deaver | 330/267 |

*Primary Examiner*—Paul Gensler
*Assistant Examiner*—Patricia T. Nguyen
*Attorney, Agent, or Firm*—Hickman Coleman & Hughes, LLP

[57] ABSTRACT

The present invention reduces certain unwanted transients in an output stage by sensing the power supply and disabling the output stage output devices in correlation with the sensing of an invalid bias. In preferred embodiments, the bias is measured at a node that is the last bias node to reach a steady state during power up or power glitches. This ensures that all portions of the output stage are being provided a valid bias prior to enabling the output devices of the output stage. By enabling the output devices only after a valid bias is present, signals generated by the output devices are based upon valid operation of the output stage.

60 Claims, 7 Drawing Sheets

CIRCUITS FOR PREVENTING UNWANTED OUTPUT TRANSIENTS IN AMPLIFIERS DURING POWER-UP

TECHNICAL FIELD

The present invention is related to amplifiers such as output amplifiers used in D/A converters. More specifically, the present invention teaches a variety of circuits suitable for resisting unwanted output transients in amplifiers during power-up and other periods when the power supply is invalid or unstable.

BACKGROUND ART

Digital-to-analog (D/A) converters and their output amplifiers experience power glitches, causing erratic performance in the systems being driven by the D/A converters. For example, control systems driven by these devices can misfire due to power-up glitches occurring before the D/A converter stabilizes to normal operation.

Prior Art FIG. 1 illustrates a simplified prototypical output stage 10 that suffers from such power-up glitches. The output stage 10 includes an operational amplifier 20 driving an output device 30. The output device 30 has a PMOS transistor M3 coupled in parallel with a capacitor CC1, and an NMOS transistor M4 coupled in parallel with a capacitor CC2. The source of the PMOS transistor M3 is directly coupled to a power supply Vdd while the source of the NMOS transistor M4 is coupled to a common ground reference. The output signal of the output stage 10 is generated at the coupling of the drains of the PMOS and NMOS transistors M3 and M4.

During steady-state operation of the output stage 10, the supply voltage Vdd and the bias current $I_b$ provided to the op amp 20 are presumptively valid and the internal circuitry of the output stage 10 can thus achieve a proper state. However, when the bias current is invalid, the state of the internal circuitry of the output stage 10 is uncertain and may not be meaningful. This occurs, e.g., during power-up as the supply voltage Vdd rises to a valid steady state. While Vdd ramps up, bias current $I_b$ exists but is invalid. However, even an invalid supply voltage Vdd can cause the gate of the PMOS transistor M3 to remain low due to device characteristics such as parasitic capacitance. As Vdd rises, a gate to source voltage is generated at the PMOS transistor M3 causing it to turn on.

Prior Art FIG. 2 is a schematic of one particular output stage 10' that helps illustrate one source of the power glitch dilemma. The output stage 10' includes a folded cascode amplifier 22, a class AB control amplifier 24 (or "output quiescent control stage") and output devices 30. An on-chip bias current generator (not shown) provides a bias current $I_b$ and four current mirrors MR1–MR4 amplify and distribute the bias current $I_b$ to the different devices within the output stage 10'. The provision of bias current to the folded cascode amplifier 22 requires that Vdd be sufficient to overcome a two NMOS Vt voltage step down through MR3. In contrast, the provision of bias current to the output devices 30 requires that Vdd be sufficient to overcome a one Vt voltage step down in order to be valid. In essence, the bias current $I_b$ must conduct through four current mirrors before becoming valid at each stage of the output stage 10'. Thus the output devices 30 become active during power-up before the op amp 22 is operating in a valid state.

Certain power glitch problems can be addressed by isolating the output of the internal circuitry from the output of the chip housing the internal circuitry. Prior art techniques have accomplished this through isolation switches controlled by a window comparator that compares the supply voltage Vdd with two fixed comparison thresholds. Specifically, logic outputs from the window comparator control the isolation switches, connecting the chip output either to the internal circuitry output (when the supply voltage is valid) or to a fixed voltage potential. This ensures that the chip output is either valid or set to a known voltage state (e.g., a common ground reference).

The isolation approach of the prior art presents at least three drawbacks. First, since wake up times for bias circuits, amplifiers, and other related circuit devices change with process, voltage and temperature, the comparison thresholds must be set for the worst case scenario. This unnecessarily compromises power up latency for all other scenarios. Second, the isolation switches add additional parasitic effects (e.g., resistance and capacitance) at the output. This can be especially bad in circuits utilizing feedback, as the parasitic effects alter the feedback characteristics. Finally, the isolation switches merely isolate the power glitches and do not eliminate them or prevent related internal problems in any way. For example, large crowbar currents flowing in the internal circuitry typically accompany power glitches. These large crowbar currents can cause the device to latch-up.

DISCLOSURE OF THE INVENTION

The present invention teaches a variety of circuitry and methods suitable for reducing unwanted transient signals at an amplifier output stage. Methods of the present invention contemplate reduction of certain unwanted transients in an output stage through sensing the power supply and disabling the output stage output devices in correlation with the sensing of an invalid bias. In certain embodiments, the bias is measured at a node that is the last bias node to reach a steady state during power up or power glitches. This ensures that all portions of the output stage are being provided a valid bias prior to enabling the output devices of the output stage. Another embodiment senses a node that is not the last to be valid, but compensates by including some delay prior to enabling the output devices. In any event, by enabling the output devices only after a valid bias is present, signals generated by the output devices are based upon valid operation of the output stage.

One aspect of the present invention teaches a transient resistant output stage comprising amplifier circuitry and a bias sensor. The amplifier circuitry includes an input, an output, an output device, a bias input, and a control input. The output device is operable to generate an electrical output signal at the output and the amplifier circuitry responds to an input electrical signal received at the input by generating this electrical output signal. The amplifier circuitry is powered, at least in part, by a power supply received at the bias input. Control of the amplifier circuitry is as follows. A first control signal received at the control input enables the output device and a second control signal received at the control input disables the output device.

The bias sensor has a sensing input and a control output. The sensing input is coupled to the power supply and the control output is electrically coupled to the control input of the amplifier circuitry. The bias sensor is operable to sense the power supply and determine whether the power supply is valid. In response to a valid power supply, the bias sensor generates the first signal at the control output. In response to an invalid power supply, the bias sensor generates the second signal at the control output.

Another embodiment of the present invention contemplates construction of a digital-to-analog converter (DAC)

with the applicants' transient resistant amplifier. The DAC includes a digital data latch, control logic coupled to the digital data latch, converter circuitry generating an analog signal in response to digital data received from the digital data latch, and a transient resistant output stage amplifying the analog output into a form suitable for driving a load.

BRIEF DESCRIPTION OF THE DRAWINGS

Prior Art

Prior Art

FIG. 7 is a schematic of a portion of a sensing device of the present invention having trigger delay built-in.

BEST MODES FOR CARRYING OUT THE INVENTION

The present invention reduces certain unwanted transients in an output stage by sensing the power supply and disabling the output stage output devices in correlation with the sensing of an invalid bias. In preferred embodiments, the bias is measured at a node that is the last bias node to reach a steady state during power up or power glitches. This ensures that all portions of the output stage are being provided a valid bias prior to enabling the output devices of the output stage. By enabling the output devices only after a valid bias is present, signals generated by the output devices are based upon valid operation of the output stage.

Figure 3:
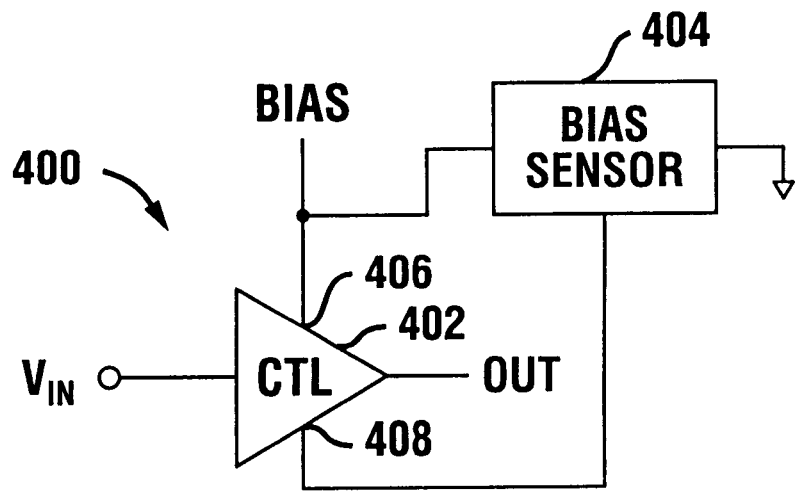
FIG. 3 is a block diagram of a single ended transient resistant output stage in accordance with a first embodiment of the present invention.
Figure 4:
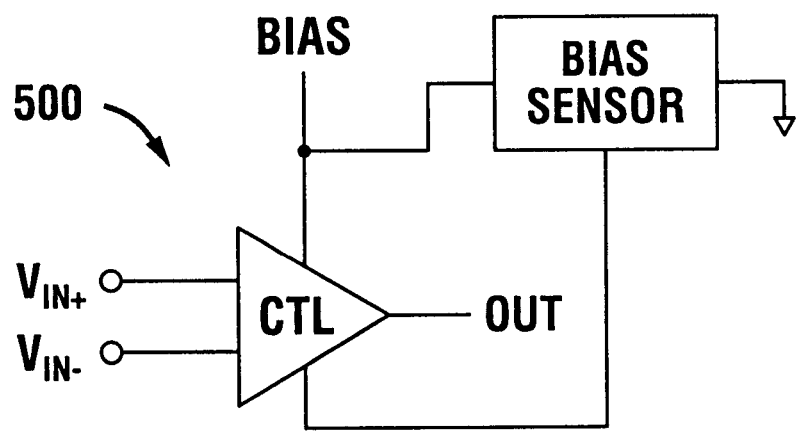
FIG. 4 is a block diagram of a differential transient resistant output stage in accordance with another embodiment of the present invention.

FIGS. 3 and 4 illustrate two possible implementations of the present invention. FIG. 3 is a block diagram of a single ended transient resistant output stage 400 in accordance with one embodiment of the present invention. The transient resistant output stage 400 includes amplifier circuitry 402 and a bias sensor 404. The amplifier circuitry 402 includes a bias input 406 coupled to the bias power source and a control input 408 that is responsive to enable and disable output devices of the amplifier circuitry 402. The bias sensor 404 has an input 410 coupled to the bias node 406 and an output 412 coupled to the control input 408 of the amplifier circuitry 402. The bias sensor 404 is operable to determine whether the power supply is valid and then disable or enable the output devices of the amplifier circuitry 402 accordingly.

FIG. 4 is a block diagram of a differential transient resistant output stage 500 in accordance with another embodiment of the present invention. The output stage 500 operates similar to the output stage 400 of FIG. 3. In light of the above description of FIG. 3, those skilled in the art will readily understand operation the operation of the output stage 500.

Figure 5:
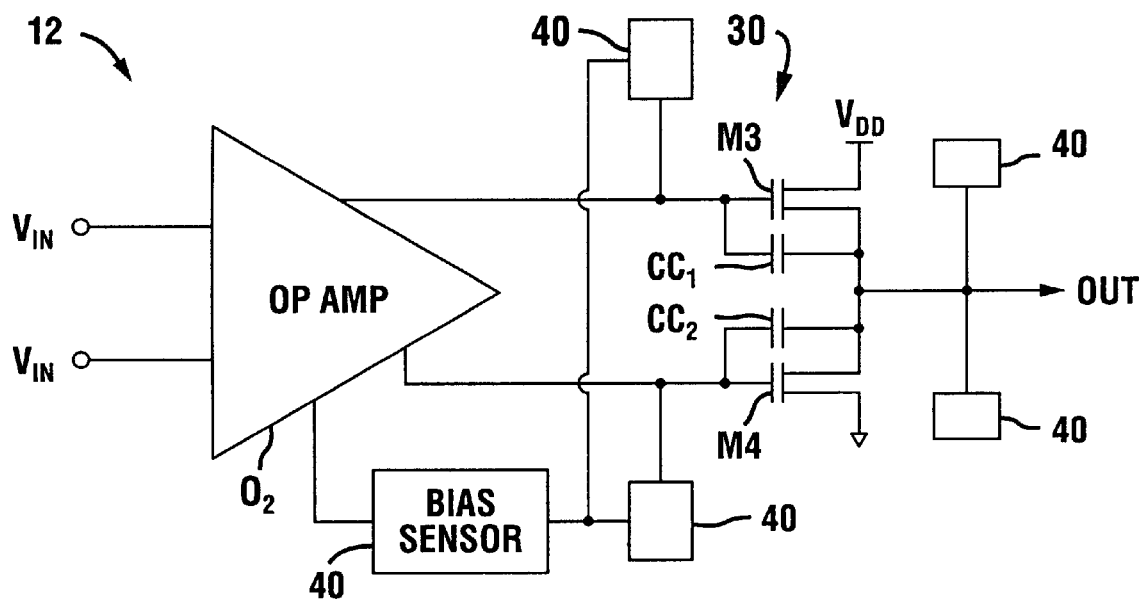
FIG. 5 is a schematic of one transient resistant output stage in accordance with yet another embodiment of the present invention.

FIG. 5 illustrates a transient resistant output stage 12 in accordance with yet another embodiment of the present invention. The transient resistant output stage 12 includes an operational amplifier (or, "op amp") 20, an output device 30 and a transient prevention circuit 40. The output device 30 has a PMOS transistor M3 coupled in parallel with a capacitor CC1, and an NMOS transistor M4 coupled in parallel with a capacitor CC2. The source of the PMOS transistor M3 is directly coupled to a power supply Vdd while the source of the NMOS transistor M4 is coupled to a common ground reference. The output stage output signal Vout is generated at the coupling of the drains of the NMOS and PMOS transistors M3 and M4.

Figure 1:
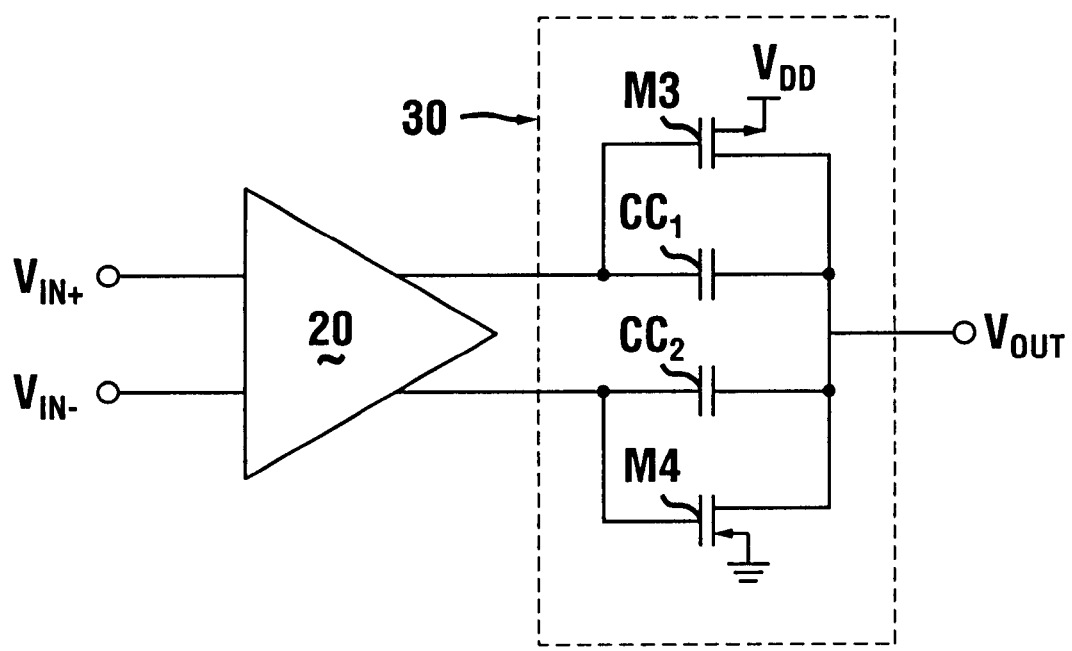
FIG. 1 is a schematic of a simplified prototypical output stage.
Figure 2:
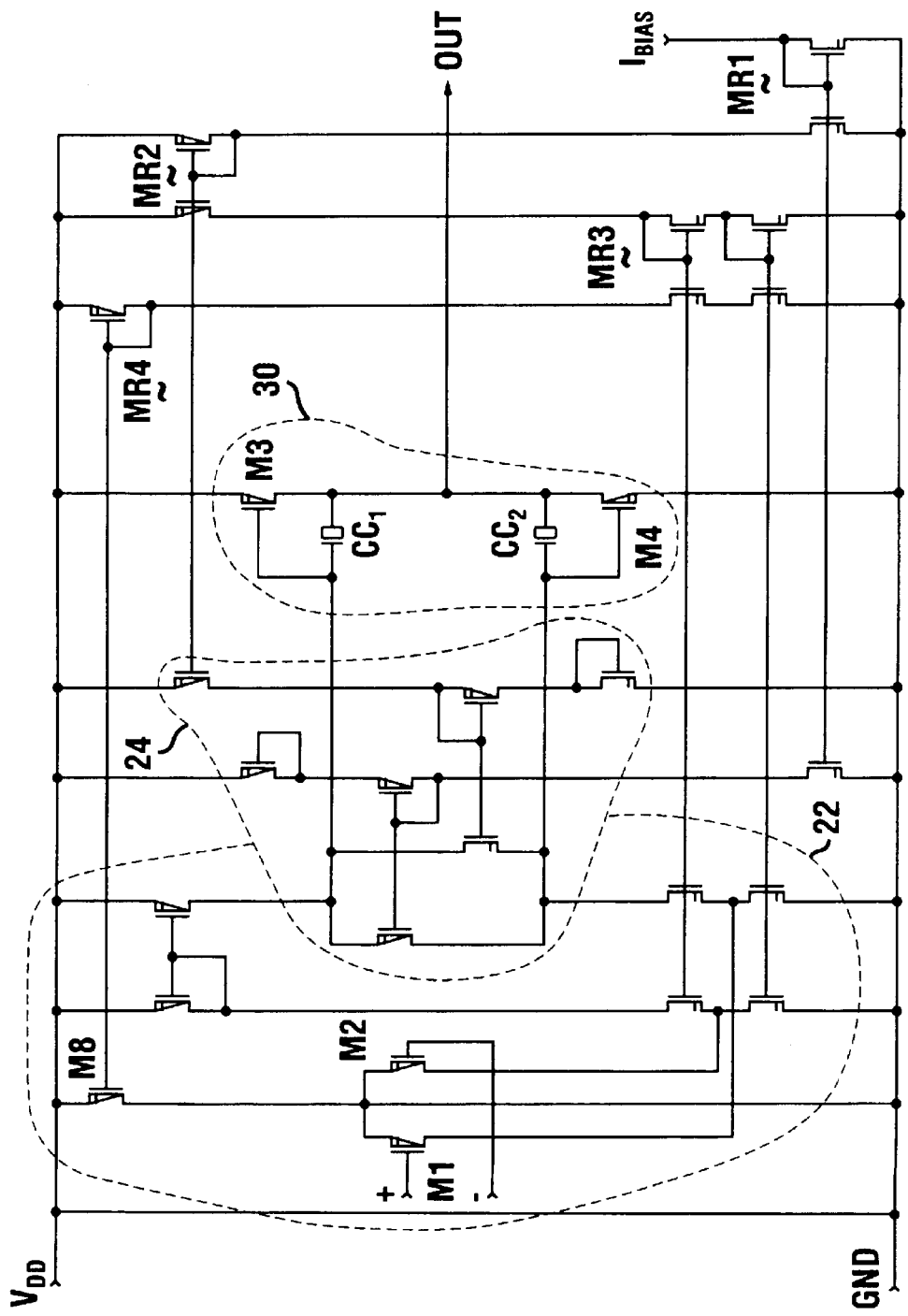
FIG. 2 is a more detailed schematic of the output stage of FIG. 1.

Like the circuit 10 of FIG. 1, during steady-state operation of the output stage 10, the supply voltage Vdd and the bias current $I_b$ provided to the op amp 20 are fully valid and the internal circuitry of the output stage 10 are in their proper states. However, should the bias current be invalid, the state of the internal circuitry of the output stage 10 is uncertain and may not be meaningful. This happens, e.g., during power-up as the supply voltage Vdd ramps up. While Vdd ramps up, the bias current $I_b$ is not proper. If this problem is not addressed, the supply voltage Vdd can cause the gate of the PMOS device to remain low due to parasitic capacitance and such. As Vdd rises a gate to source voltage may arise on the PMOS transistor causing the PMOS transistor to turn on.

The transient prevention circuit 40 addresses this problem by preventing application of uncertain voltages onto the gates of both the NMOS and PMOS transistors M3 and M4. To accomplish this, the transient prevention circuit 40 provides a bias current sensor for sensing a node in the op amp 20 and sending a control signal to devices that control the gates of the output devices NMOS transistor M4 and PMOS transistor M3.

Figure 6:
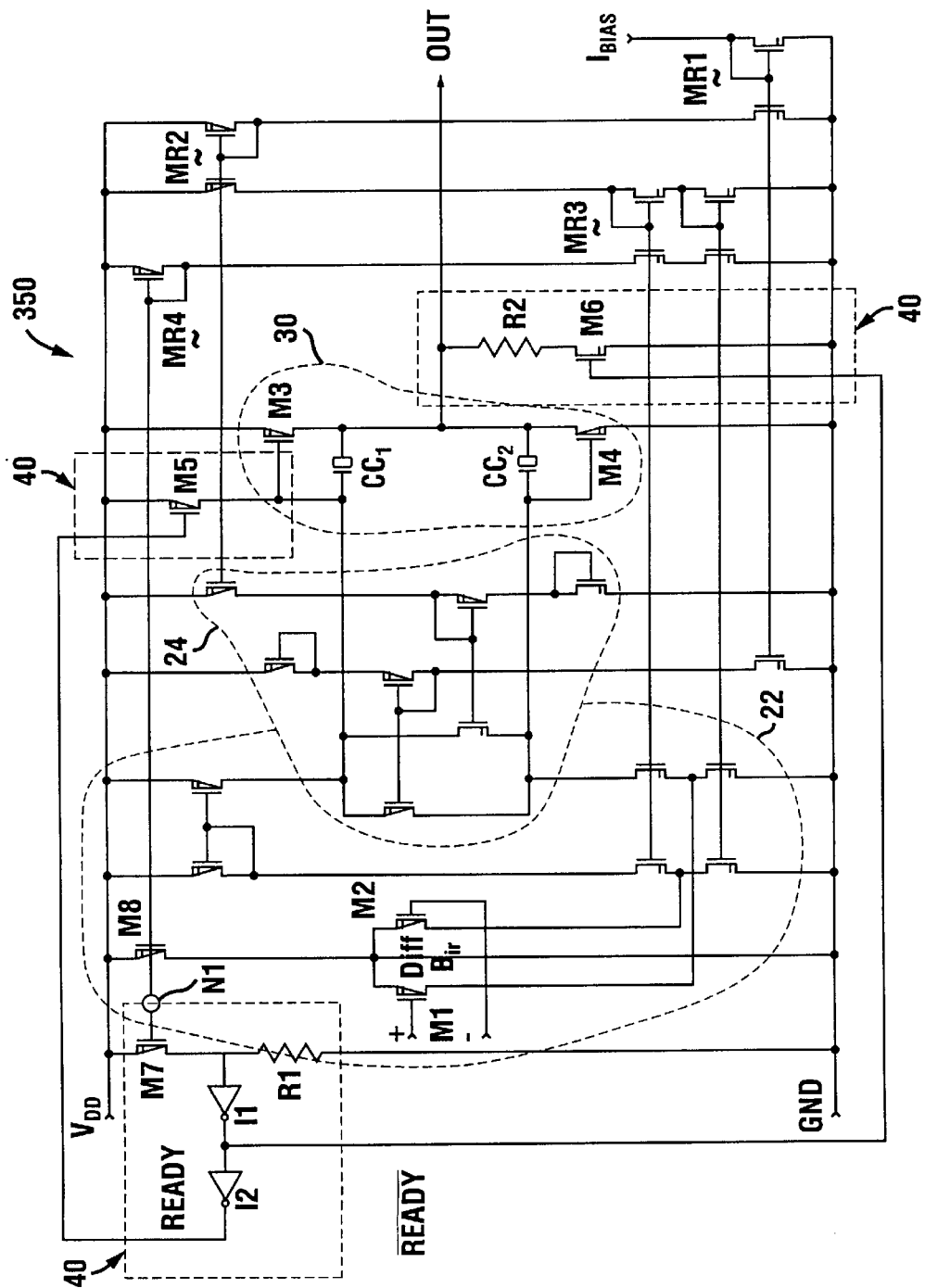
FIG. 6 is a schematic of a second transient resistant output stage in accordance with still another embodiment of the present invention.

FIG. 6 is a schematic of a class AB rail-to-rail output amplifier 350 in accordance with one embodiment of the present invention. The output amplifier 350 includes a folded cascode amplifier 22, an output quiescent current control stage 24, an output device 30, four current mirrors MR1–MR-4, and a transient prevention circuit 40. The input circuitry of the folded cascode amplifier 22 is a differential pair of transistors M1 and M2 that is essentially a transconductance stage arranged to receive a differential input voltage $V_{IN+}$ and $V_{IN-}$. By steering current from a transistor M8, the differential pair M1 and M2 convert the input voltage into a current signal more suitable for amplification by subsequent circuitry within the folded cascode amplifier 22. The differential current signal generated by the folded cascode amplifier 22 then drives the output quiescent current control stage 24, which in turn generates gate voltages across transistors M3 and M4 of the output device 30.

The transient prevention circuit 40 operates by sensing the presence of a valid bias current $I_b$ before allowing any appreciable voltage Vgs to be developed at the transistor M3 by pulling the gate of the transistor M3 to a supply voltage Vdd through the PMOS transistor M5. In addition, the output voltage Vout is pulled to the common ground reference through an NMOS transistor M6. The NMOS transistor M6 is selected as a small device, thus it is preferred that a resistor $R_2$ be coupled in series therewith to prevent possible electrostatic discharge (ESD) damage to the NMOS transistor M6.

Note that devices I1, I2, R1 and M7 perform the current sensing at a node N1 that is subsequent to the last current mirror MR4. The importance of this configuration is that the op amp node sensed is a node that last becomes valid during power up. This tends to ensure that control of the op amp can be safely released without generating glitches at the output of the transient resistant output stage 350. Additionally, in the embodiment of FIG. 6, the sensed node N1 has a stable voltage during steady-state operation. This ensures that the sensor only interrupts operation of the output devices when the power supply is acting unstable.

For a variety of reasons it may be beneficial to delay enabling the output devices even beyond the initial sensing of a valid bias current or supply voltage. For example, the output stage circuit devices may exhibit temporary instability even after a valid bias current or supply voltage is made available. Also, the power supply may be somewhat unstable itself, oscillating around prior to settling at a persistent valid state. Or, perhaps the node within the output stage that last becomes valid is not stable during steady-state operation, requiring sensing of a different node.

Figure 7:
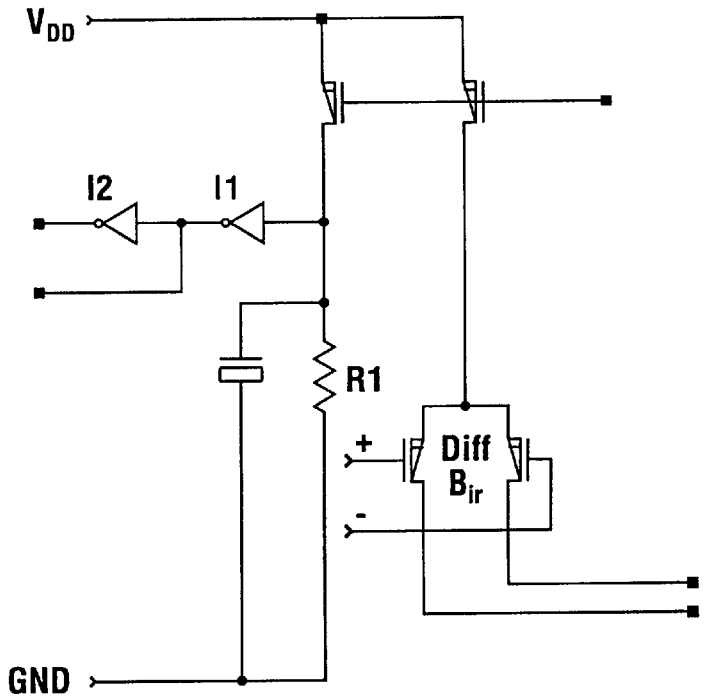

In situations where more delay is required before the "ready" signal is produced, adding more delay is fairly straightforward. The circuit of FIG. 7, e.g., provides an RC time delay by simply coupling a capacitor C in parallel with the resistor $R_1$. Those of skill in the art will appreciate that a wide variety of techniques are available for adding delay. For example, additional inverters can be added in series with the inverters I1 and I2 and the ready signal taken after the additional inverters.

Figure 8:
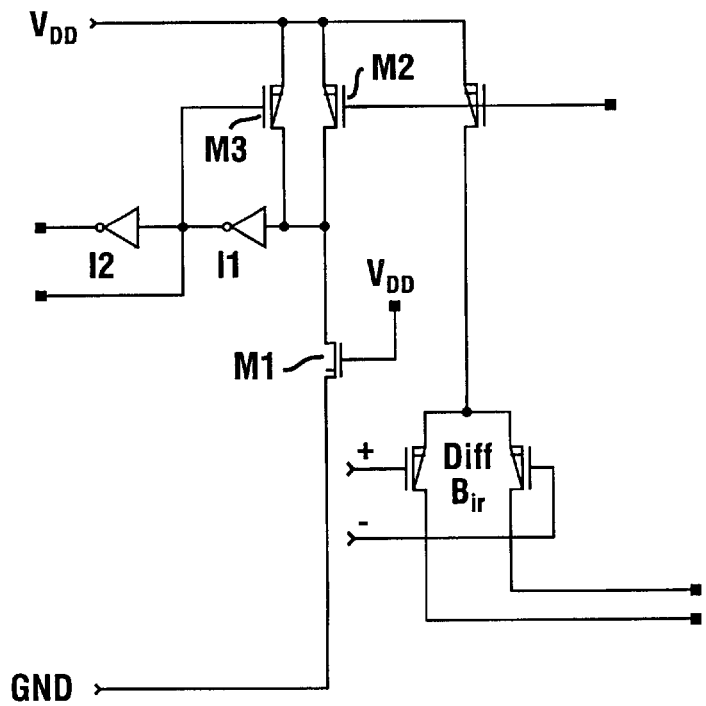
FIG. 8 is a schematic of a portion of a sensing device of the present invention including hysteresis in the output device control algorithm.

FIG. 8 illustrates two variations on the bias circuits discussed above. As will be appreciated, resistors and explicit capacitors may not be available in CMOS processes. However, use of a weak (i.e., small W/L ratio) NMOS device M1 that is sized appropriately to be easily overpowered by the replica current works well. Adding transistor M3 introduces hysteresis around the inverter I1 thereby improving the power supply rejection of the bias sensing circuit. The device M3 thus helps block multiple trigger events as the power supply ramps to its final value.

Figure 9:
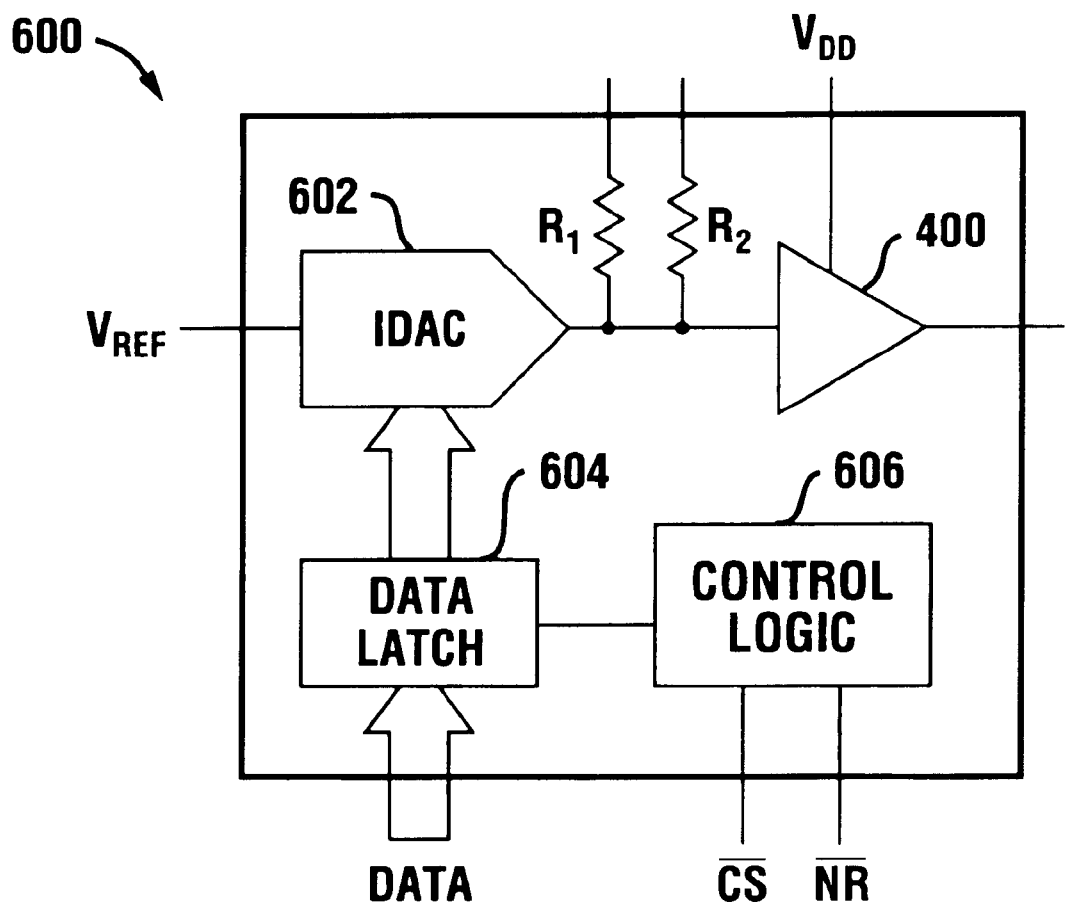
FIG. 9 is a block diagram of a digital-to-analog converter (DAC) in accordance with one embodiment of the present invention.

Turning next to FIG. 9, a monolithic digital-to-analog converter (DAC) 600 in accordance with one embodiment of the present invention will now be described. One important application of the transient resistant output stages of the present invention is within the DAC setting. As mentioned in the Background of the Invention, DAC operation is particularly sensitive to power up glitches. Hence utilizing the transient resistant output stages of the present invention within DACs is of particular benefit.

The monolithic DAC 600 of FIG. 9 is formed upon a single integrated circuit (IC) chip and includes converter circuitry 602, a data latch 604, control logic 606 and a transient resistant output stage 400. Those skilled in the art of electronic design will be well familiar with the operation of DAC circuits and therefore the operation of the DAC 600 is only briefly described herein. In brief, digital data is provided to the data latch 604. Under control of the control logic 606, the data latch 604 stores the digital data and forwards such data onto the converter circuitry 602. The converter circuitry 602 converts the numeric value represented by the digital data received from the data latch 604 into an analog voltage signal suitable for amplification by the transient resistant output stage 400. The transient resistant output stage 400 thus provides an analog output signal that is protected from transients and power glitches as described above.

Although only a few embodiments of the present invention have been described in detail herein, it should be understood that the present invention may be embodied in many other specific forms without departing from the spirit or scope of the invention. Therefore, the present examples and embodiments are to be considered as illustrative and not restrictive, and the invention is not to be limited to the details given herein, but may be modified within the scope of the appended claims.

We claim:

1. A transient resistant output stage comprising:

amplifier circuitry including an input, an output, an output device, a bias input, and a control input, the output device being coupled to the output, the output device being operable to generate an electrical output signal at the output, the amplifier circuitry being intended to respond to an input electrical signal received at the input by generating the electrical output signal, the amplifier circuitry powered at least in part by a power supply received at the bias input, wherein a first control signal received at the control input enables the output device and a second control signal received at the control input disables the output device; and a bias sensor having a sensing input and a control output, the sensing input coupled to the power supply, the control output electrically coupled to the control input of the amplifier circuitry, the bias sensor operable to sense the power supply and determine whether the power supply is valid, the bias sensor further operable to generate the first signal at the control output in response to a valid power supply and the second signal at the control output in response to an invalid power supply.

2. A transient resistant output stage comprising:

amplifier circuitry including an input, an output, an output device, a bias input, and a control input, the output device being coupled to the output, the output device being operable to generate an electrical output signal at the output, the output device including a PMOS transistor coupled in parallel with a first capacitor across the gate and drain of the PMOS transistor, an NMOS transistor coupled in parallel with a second capacitor across the gate and drain of the NMOS transistor, the source of the PMOS transistor being directly coupled to the power supply, the source of the NMOS transistors being coupled to a common ground reference, and the drains of the PMOS and NMOS transistors being coupled to the output of the amplifier stage, the amplifier circuitry being intended to respond to an input electrical signal received at the input by generating the electrical output signal, the amplifier circuitry powered at least in part by a power supply received at the bias input, wherein a first control signal received at the control input enables the output device and a second control signal received at the control input disables the output device; and a bias sensor having a sensing input and a control output, the sensing input coupled to the power supply, the control output electrically coupled to the control input of the amplifier circuitry, the bias sensor operable to sense the power supply and determine whether the power supply is valid, the bias sensor further operable to generate the first signal at the control output in response to a valid power supply and the second signal at the control output in response to an invalid power supply.

3. A transient resistant output stage comprising:

amplifier circuitry including an input, an output, an output device, a bias input, and a control input, an operational amplifier ("op amp"), the op amp being coupled to and driven by the amplifier circuitry input, the op amp having first and second output nodes, the first op amp output node coupled to the gate of the PMOS transistor and the second op amp output node coupled to the gate of the NMOS transistor, the output device being coupled to the output, the output device being operable to generate an electrical output signal at the output, the amplifier circuitry being intended to respond to an input electrical signal received at the input by generating the electrical output signal, the amplifier circuitry powered at least in part by a power supply received at the bias input, wherein a first control signal received at the control input enables the output device and a second control signal received at the control input disables the output device; and a bias sensor having a sensing input and a control output, the sensing input coupled to the power supply, the control output electrically coupled to the control input of the amplifier circuitry, the bias sensor operable to sense the power supply and determine whether the power supply is valid, the bias sensor further operable to generate the first signal at the control output in response to a valid power supply and the second signal at the control output in response to an invalid power supply.

4. A transient resistant output stage as recited in claim 3 wherein the op amp includes a folded cascode amplifier and a output quiescent current control stage.

5. A transient resistant output stage as recited in claim 4 further comprising four current mirrors arranged to distribute bias current to the folded cascode amplifier, the output quiescent current control stage, and the output device.

6. A transient resistant output stage as recited in claim 5 wherein the bias sensor sensing input is coupled to an output of a one of the four current mirrors that is the last to reach a steady-state during power-up operation.

7. A transient resistant output stage as recited in claim 1 wherein the bias sensor sensing input is coupled to a selected node within the amplifier circuitry that is stable during steady-state operation.

8. A transient resistant output stage comprising:
   amplifier circuitry including an input, an output, an output device, a bias input, and a control input, the output device being coupled to the output, the output device being operable to generate an electrical output signal at the output, the amplifier circuitry being intended to respond to an input electrical signal received at the input by generating the electrical output signal, the amplifier circuitry powered at least in part by a power supply received at the bias input, wherein a first control signal received at the control input enables the output device and a second control signal received at the control input disables the output device; and
   a bias sensor having a sensing input and a control output, the sensing input coupled to a selected node within the amplifier circuitry that is stable during steady-state operation, wherein the selected node is a last node to reach a steady-state during power-up operation, the control output electrically coupled to the control input of the amplifier circuitry the bias sensor operable to sense the selected node and determine whether the selected node is valid, the bias sensor further operable to generate the first signal at the control output in response to a valid selected node and the second signal at the control output in response to an invalid selected node.

9. A transient resistant output stage as recited in claim 8 wherein the bias sensor includes hysteresis circuitry enabling control of the output device of the amplifier circuitry to take into consideration the recent behavior of the power supply in order to decrease or block multiple events that would trigger switching from the second control signal to the first control signal.

10. A transient resistant output stage as recited in claim 7 wherein the bias sensor includes some delay in responding to events that would trigger switching from the second control signal to the first control signal.

11. A transient resistant output stage comprising:
    amplifier circuitry including an input, an output, an output device, a bias input, and a control input, the output device being coupled to the output, the output device being operable to generate an electrical output signal at the output, the amplifier circuitry being intended to respond to an input electrical signal received at the input by generating the electrical output signal, the amplifier circuitry powered at least in part by a power supply received at the bias input, wherein a first control signal received at the control input enables the output device and a second control signal received at the control input disables the output device; and
    a bias sensor having a sensing input and a control output, the sensing input coupled to a selected node within the amplifier circuitry that is stable during steady-state operation, wherein the selected node reaches a steady-state during power-up of the power supply before at least one other node within the amplifier circuitry reaches a steady-state, the control output electrically coupled to the control input of the amplifier circuitry, the bias sensor operable to sense the selected node and determine whether the selected node is valid, the bias sensor further operable to generate the first signal at the control output in response to a valid selected node and the second signal at the control output in response to an invalid selected node.

12. A transient resistant output stage as recited in claim 11 wherein the bias sensor includes some delay in responding to events that would trigger switching from the second control signal to the first control signal.

13. A transient resistant output stage as recited in claim 12 wherein the delay is intended to prevent the bias sensor from switching the second control signal to the first control signal until after all nodes within the amplifier circuitry have reached a steady-state.

14. A transient resistant output stage as recited in claim 2 wherein the bias sensor includes:
    a second PMOS transistor having a source directly coupled to the power supply, a drain coupled in series with a resistor $R_1$ to the common ground, and a gate coupled to a selected node within the amplifier circuitry that is stable during steady-state operation;
    a second NMOS transistor having a source directly coupled to the common ground reference, a drain coupled in series with a resistor $R_2$ to the output of the amplifier circuitry, and a gate;
    a third PMOS transistor having a source directly coupled to the power supply, a drain coupled to the gate of the first PMOS transistor found in the output device, and a gate;
    a first inverter having an input coupled to the drain of the second PMOS transistor and an output coupled the gate of the second NMOS transistor; and
    a second inverter having an input coupled to the output of the first inverter and an output coupled to the gate of the third PMOS transistor.

15. A transient resistant output stage as recited in claim 14 wherein the selected node is a last node to reach a steady-state during power-up operation.

16. A transient resistant output stage as recited in claim 14 wherein the bias sensor includes hysteresis circuitry enabling control of the output device of the amplifier circuitry to take into consideration the recent behavior of the power supply in order to decrease or block multiple events that would trigger switching from the second control signal to the first control signal.

17. A transient resistant output stage as recited in claim 16 wherein the hysteresis circuitry includes a fourth PMOS transistor having a source directly coupled to the power supply, a gate coupled to the output of the first inverter, and a drain coupled to the drain of the second PMOS transistor.

18. A transient resistant output stage as recited in claim 14 wherein the bias sensor includes some delay in responding to events that would trigger switching from the second control signal to the first control signal.

19. A transient resistant output stage as recited in claim 18 wherein the delay is provided at least in part by the bias sensor further including a first capacitor coupled in parallel with the resistor $R_1$.

20. A transient resistant output stage as recited in claim 14 wherein the selected node reaches a steady-state during power-up of the power supply after all other nodes within the amplifier circuitry reach a steady-state.

21. A digital-to-analog converter (DAC) comprising:
a digital data latch having a data input, a data output, and a control input, the digital data latch arranged to receive, store, and forward digital data;
control logic coupled to the digital data latch and operable to control the digital data latch;
converter circuitry coupled to the data output of the digital data latch, the converter circuitry operable to generate an analog signal in response to digital data forwarded from the digital data latch; and
a transient resistant output stage including:
amplifier circuitry including an input driven by the analog signal generated by the converter circuitry, an output, an output device, a bias input, and a control input, the output device being coupled to the output, the output device being operable to generate an electrical output signal at the output, the amplifier circuitry being intended to respond to an input electrical signal received at the input by generating the electrical output signal, the amplifier circuitry powered at least in part by a power supply received at the bias input, wherein a first control signal received at the control input enables the output device and a second control signal received at the control input disables the output device; and
a bias sensor having a sensing input and a control output, the sensing input coupled to the power supply, the control output electrically coupled to the control input of the amplifier circuitry, the bias sensor operable to sense the power supply and determine whether the power supply is valid, the bias sensor further operable to generate the first signal at the control output in response to a valid power supply and the second signal at the control output in response to an invalid power supply.

22. A DAC as recited in claim 21 wherein the output device includes a PMOS transistor coupled in parallel with a first capacitor across the gate and drain of the PMOS transistor, an NMOS transistor coupled in parallel with a second capacitor across the gate and drain of the NMOS transistor, the source of the PMOS transistor being coupled to the power supply, the source of the NMOS transistor being coupled to a common ground reference, and the drains of the PMOS and NMOS transistors being coupled to the output of the amplifier circuitry.

23. A DAC as recited in claim 21 wherein the amplifier circuitry further includes an operational amplifier ("op amp") coupled to and driven by the amplifier circuitry input, the op amp having first and second output nodes, the first op amp output node coupled to the gate of the PMOS transistor and the second op amp output node coupled to the gate of the NMOS transistor.

24. A DAC as recited in claim 23 wherein the op amp includes a folded cascode amplifier and a output quiescent current control stage.

25. A DAC as recited in claim 24 further comprising four current mirrors arranged to distribute bias current to the folded cascode amplifier, the output quiescent current control stage, and the output device.

26. A DAC as recited in claim 25 wherein the bias sensor sensing input is coupled to an output of one of the four current mirrors that is the last to reach a steady-state during power-up operation.

27. A DAC as recited in claim 21 wherein the bias sensor sensing input is coupled to a selected node within the amplifier circuitry that is stable during steady-state operation.

28. A DAC as recited in claim 27 wherein the selected node is a last node to reach a steady-state during power-up operation.

29. A DAC as recited in claim 28 wherein the bias sensor includes hysteresis circuitry enabling control of the output device of the amplifier circuitry to take into consideration the recent behavior of the power supply in order to decrease or block multiple events that would trigger switching from the second control signal to the first control signal.

30. A DAC as recited in claim 27 wherein the bias sensor includes some delay in responding to events that would trigger switching from the second control signal to the first control signal.

31. A DAC as recited in claim 27 wherein the selected node reaches a steady-state during power-up of the power supply after all other nodes within the amplifier circuitry reach a steady-state.

32. A DAC as recited in claim 31 wherein the bias sensor includes some delay in responding to events that would trigger switching from the second control signal to the first control signal.

33. A DAC as recited in claim 32 wherein the delay is intended to prevent the bias sensor from switching the second control signal to the first control signal until after all nodes within the amplifier circuitry have reached a steady-state.

34. A DAC as recited in claim 32 wherein the bias sensor includes:
a second PMOS transistor having a source directly coupled to the power supply, a drain coupled in series with a resistor $R_1$ to the common ground, and a gate coupled to a selected node within the amplifier circuitry that is stable during steady-state operation;
a second NMOS transistor having a source directly coupled to the common ground reference, a drain coupled in series with a resistor $R_2$ to the output of the amplifier circuitry, and a gate;
a third PMOS transistor having a source directly coupled to the power supply, a drain coupled to the gate of the first PMOS transistor found in the output device, and a gate;

a first inverter having an input coupled to the drain of the second PMOS transistor and an output coupled the gate of the second NMOS transistor; and a second inverter having an input coupled to the output of the first inverter and an output coupled to the gate of the third PMOS transistor.

35. A DAC as recited in claim 34 wherein the selected node is a last node to reach a steady-state during power-up operation.

36. A DAC as recited in claim 34 wherein the bias sensor includes hysteresis circuitry enabling control of the output device of the amplifier circuitry to take into consideration the recent behavior of the power supply in order to decrease or block multiple events that would trigger switching from the second control signal to the first control signal.

37. A DAC as recited in claim 36 wherein the hysteresis circuitry includes a fourth PMOS transistor having a source directly coupled to the power supply, a gate coupled to the output of the first inverter, and a drain coupled to the drain of the second PMOS transistor.

38. A DAC as recited in claim 34 wherein the bias sensor includes some delay in responding to events that would trigger switching from the second control signal to the first control signal.

39. A DAC as recited in claim 38 wherein the delay is provided at least in part by the bias sensor further including a first capacitor coupled in parallel with the resistor $R_1$ and a second capacitor coupled in parallel with the resistor $R_2$.

40. A DAC as recited in claim 34 wherein the selected node reaches a steady-state during power-up of the power supply before at least one other node within the amplifier circuitry reaches a steady-state.

41. An amplifier having an output device, the amplifier comprising:

means for providing the amplifier a power supply;

means for distributing the power supply throughout the amplifier;

means for sensing a selected node within the amplifier, the selected node being one that is stable when the power supply is in a steady-state; and means for controlling the output device of the amplifier such that the output device is disabled when the power supply is not in a steady-state.

42. An amplifier as recited in claim 41 wherein the means for distributing the power supply includes means for distributing bias current to a plurality of nodes within the amplifier, the sensed selected node being a one of the plurality of nodes provided bias current.

43. An amplifier as recited in claim 42 wherein the means for distributing bias current to a plurality of nodes within the amplifier includes current mirrors.

44. An amplifier having an output device, the amplifier comprising:

means for providing the amplifier a power supply;

means for distributing the power supply throughout the amplifier, including means for distributing bias current to a plurality of nodes within the amplifier;

means for sensing a selected node within the amplifier, the selected node being one that is stable when the power supply is in a steady-state, the sensed selected node being a one of the plurality of nodes provided bias current, wherein the selected node is a last node to receive a valid bias current during a power-up operation; and means for controlling the output device of the amplifier such that the output device is disabled when the power supply is not in a steady-state.

45. An amplifier having an output device, the amplifier comprising:

means for providing the amplifier a power supply;

means for distributing the power supply throughout the amplifier, including means for distributing bias current to a plurality of nodes within the amplifier;

means for sensing a selected node within the amplifier, the selected node being one that is stable when the power supply is in a steady-state, the sensed selected node being a one of the plurality of nodes provided bias current, wherein the selected node receives a valid bias current during a power-up operation after all of the plurality of nodes receives a valid bias current; and means for controlling the output device of the amplifier such that the output device is disabled when the power supply is not in a steady-state.

46. An amplifier as recited in claim 45, wherein means for controlling the output device of the amplifier includes means for enabling the output device only after the power supply has reached a steady-state.

47. An amplifier as recited in claim 46 wherein the means for controlling the output device of the amplifier further includes means for enabling the output device after a set delay period has passed, the delay period initiating once the means for sensing a selected node within the amplifier has sensed a valid power supply.

48. An amplifier as recited in claim 41 wherein the means for controlling the output device includes means for enabling the output device only after the power supply has reached a steady-state.

49. An amplifier as recited in claim 48 wherein the means for controlling the output device of the amplifier further includes means for enabling the output device after a set delay period has passed, the delay period initiating once the step of sensing a selected node within the amplifier has sensed a valid power supply.

50. An amplifier having an output device, the amplifier comprising:

means for providing the amplifier a power supply;

means for distributing the power supply throughout the amplifier;

means for sensing a selected node within the amplifier, the selected node being one that is stable when the power supply is in a steady-state; and means for controlling the output device of the amplifier, including means for providing hysteresis in a control algorithm, such that the output device is disabled when the power supply is not in a steady-state, wherein the means for controlling the output device includes means for enabling the output device only after the power supply has reached a steady-state.

51. A method for reducing unwanted transients at the output of an amplifier having an output device, the method comprising the acts of:

providing the amplifier a power supply;

distributing the power supply throughout the amplifier;

sensing a selected node within the amplifier, the selected node being one that is stable when the power supply is in a steady-state; and controlling the output device of the amplifier such that the output device is disabled when the power supply is not in a steady-state.

52. A method as recited in claim 51, wherein the act of distributing the power supply includes the act of distributing bias current to a plurality of nodes within the amplifier, the sensed selected node being a one of the plurality of nodes provided bias current.

53. A method as recited in claim 52 wherein the act of distributing bias current to a plurality of nodes within the amplifier includes using current mirrors to amplify the bias current.

54. A method for reducing unwanted transients at the output of an amplifier having an output device, the method comprising the acts of:

providing the amplifier a power supply;

distributing the power supply throughout the amplifier, wherein the act of distributing the power supply includes the act of distributing bias current to a plurality of nodes within the amplifier;

sensing a selected node within the amplifier, the selected node being one that is stable when the power supply is in a steady-state, the sensed selected node being a one of the plurality of nodes provided bias current, wherein the selected node is a last node to receive a valid bias current during a power-up operation; and controlling the output device of the amplifier such that the output device is disabled when the power supply is not in a steady-state.

55. A method for reducing unwanted transients at the output of an amplifier having an output device, the method comprising the acts of:

providing the amplifier a power supply;

distributing the power supply throughout the amplifier, wherein the act of distributing the power supply includes the act of distributing bias current to a plurality of nodes within the amplifier sensing a selected node within the amplifier, the selected node being one that is stable when the power supply is in a steady-state, the sensed selected node being a one of the plurality of nodes provided bias current, wherein the selected node receives a valid bias current during a power-up operation after all of the plurality of nodes receives a valid bias current; and controlling the output device of the amplifier such that the output device is disabled when the power supply is not in a steady-state.

56. A method as recited in claim 55, wherein the act of controlling the output device of the amplifier includes enabling the output device only after the power supply has reached a steady-state.

57. A method as recited in claim 56 wherein the act of controlling the output device of the amplifier further includes enabling the output device after a set delay period has passed, the delay period initiating once the step of sensing a selected node within the amplifier has sensed a valid power supply.

58. A method as recited in claim 51 wherein the act of controlling the output device includes enabling the output device only after the power supply has reached a steady-state.

59. A method as recited in claim 58 wherein the act of controlling the output device of the amplifier further includes enabling the output device after a set delay period has passed, the delay period initiating once the step of sensing a selected node within the amplifier has sensed a valid power supply.

60. A method for reducing unwanted transients at the output of an amplifier having an output device, the method comprising the acts of:

providing the amplifier a power supply;

distributing the power supply throughout the amplifier;

sensing a selected node within the amplifier, the selected node being one that is stable when the power supply is in a steady-state; and controlling the output device of the amplifier such that the output device is disabled when the power supply is not in a steady-state and the output device is enabled only after the power supply has reached a steady-state, wherein the act of controlling the output device further includes providing hysteresis in the control algorithm.

* * * * *